(12) United States Patent
Feng et al.

(10) Patent No.: US 10,665,594 B2
(45) Date of Patent: May 26, 2020

(54) SEMICONDUCTOR MEMORY DEVICE INCLUDING GATE STRUCTURE

(71) Applicants: UNITED MICROELECTRONICS CORP., Hsin-Chu (TW); Fujian Jinhua Integrated Circuit Co., Ltd., Quanzhou, Fujian Province (CN)

(72) Inventors: Li-Wei Feng, Kaohsiung (TW); Ying-Chiao Wang, Changhua County (TW); Shih-Fang Tzou, Tainan (TW)

(73) Assignees: UNITED MICROELECTRONICS CORP., Hsin-Chu (TW); Fujian Jinhua Integrated Circuit Co., Ltd., Quanzhou, Fujian Province (CN)

( * ) Notice: Subject to any disclaimer, the term of this patent is extended or adjusted under 35 U.S.C. 154(b) by 0 days.

(21) Appl. No.: 16/036,908

(22) Filed: Jul. 16, 2018

(65) Prior Publication Data

US 2019/0081048 A1  Mar. 14, 2019

(30) Foreign Application Priority Data

Sep. 13, 2017 (CN) .......................... 2017 1 0821334

(51) Int. Cl.
| | |
|---|---|
| *H01L 29/49* | (2006.01) |
| *H01L 27/108* | (2006.01) |
| *H01L 23/535* | (2006.01) |
| *H01L 29/423* | (2006.01) |
| *H01L 29/66* | (2006.01) |

(52) U.S. Cl.
CPC ...... *H01L 27/10897* (2013.01); *H01L 23/535* (2013.01); *H01L 27/10885* (2013.01); *H01L 27/10894* (2013.01); *H01L 29/42364* (2013.01); *H01L 29/4925* (2013.01); *H01L 29/6656* (2013.01); *H01L 29/6659* (2013.01)

(58) Field of Classification Search
None
See application file for complete search history.

(56) References Cited

U.S. PATENT DOCUMENTS

| | | | | |
|---|---|---|---|---|
| 5,895,947 A | * | 4/1999 | Lee | ................... H01L 27/10894 257/303 |
| 6,440,791 B1 | * | 8/2002 | Gau | ................... H01L 27/10894 257/E21.654 |
| 9,087,728 B2 | | 7/2015 | Chung | |
| 9,184,168 B2 | | 11/2015 | Ryu | |

(Continued)

*Primary Examiner* — Bilkis Jahan
(74) *Attorney, Agent, or Firm* — Winston Hsu (57) ABSTRACT

A semiconductor memory device includes a semiconductor substrate, a gate structure, a first spacer structure, and a gate connection structure. The semiconductor substrate includes a memory cell region and a peripheral region. The gate structure is disposed on the semiconductor substrate and disposed on the peripheral region. The gate structure includes a first conductive layer and a gate capping layer. The gate capping layer is disposed on the first conductive layer. The first spacer structure is disposed on a sidewall of the first conductive layer and a sidewall of the gate capping layer. The gate connection structure includes a first part and a second part. The first part penetrates the gate capping layer and is electrically connected with the first conductive layer. The second part is connected with the first part, and the second part is disposed on and contacts a top surface of the gate capping layer.

11 Claims, 5 Drawing Sheets

(56) References Cited

U.S. PATENT DOCUMENTS

| | | | |
|---|---|---|---|
| 9,640,529 B2 | 5/2017 | Song | |
| 2004/0209429 A1* | 10/2004 | Lin | H01L 21/76897 438/279 |
| 2006/0228852 A1* | 10/2006 | Chien | H01L 21/76808 438/238 |
| 2008/0277710 A1* | 11/2008 | Kim | H01L 27/105 257/309 |
| 2016/0118331 A1 | 4/2016 | Kim | |
| 2016/0155810 A1 | 6/2016 | Shin | |
| 2016/0181143 A1* | 6/2016 | Kwon | H01L 27/1052 438/586 |
| 2017/0148727 A1 | 5/2017 | Do | |

* cited by examiner

SEMICONDUCTOR MEMORY DEVICE INCLUDING GATE STRUCTURE

BACKGROUND OF THE INVENTION

1. Field of the Invention

The present invention relates to a semiconductor memory device, and more particularly, to a semiconductor memory device including a gate structure on a peripheral region.

2. Description of the Prior Art

Dynamic random access memory (DRAM) is a kind of volatile storage device which is an indispensable key part of many electronic products. DRAM includes a great number of memory cells arranged for forming an array configured to store data. Each of the memory cells may be composed of a metal oxide semiconductor (MOS) transistor and a capacitor connected in series.

The MOS transistors in the memory cells may have different structural design because of the product specification and/or the memory cell density requirements. Therefore, the structure of the MOS transistor in the memory cell may be different from that of transistors on other regions within the same chip, and the manufacturing process will become more complicated. Accordingly, it is very important for the related field to effectively integrate the manufacturing process of the memory cell and the manufacturing process of the devices in other regions.

SUMMARY OF THE INVENTION

A semiconductor memory device is provided in the present invention. A gate connection structure electrically connected with a gate structure disposed on a peripheral region may be partly formed on a top surface of a gate capping layer and contacting the top surface of the gate capping layer. Therefore, the gate connection structure and other connection structures disposed on the peripheral region and/or a memory cell region may be formed concurrently for process integration and process simplification.

According to an embodiment of the present invention, a semiconductor memory device is provided. The semiconductor memory device includes a semiconductor substrate, a gate structure, a first spacer structure and a gate connection structure. The semiconductor substrate includes a memory cell region and a peripheral region. The gate structure is disposed on the semiconductor substrate and disposed on the peripheral region. The gate structure includes a first conductive layer and a gate capping layer, and the gate capping layer is disposed on the first conductive layer. The first spacer structure is disposed on a sidewall of the first conductive layer and a sidewall of the gate capping layer. The gate connection structure includes a first part and a second part. The first part penetrates the gate capping layer and is electrically connected with the first conductive layer. The second part is connected with the first part. The second part is disposed on a top surface of the gate capping layer, and the second part contacts the top surface of the gate capping layer.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIGS. 2-5 are schematic drawings illustrating a manufacturing method of a semiconductor device according to an embodiment of the present invention, wherein FIG. 3 is a schematic drawing in a step subsequent to FIG. 2, FIG. 4 is a schematic drawing in a step subsequent to FIG. 3, and FIG. 5 is a schematic drawing in a step subsequent to FIG. 4.

DETAILED DESCRIPTION

Figure 1:
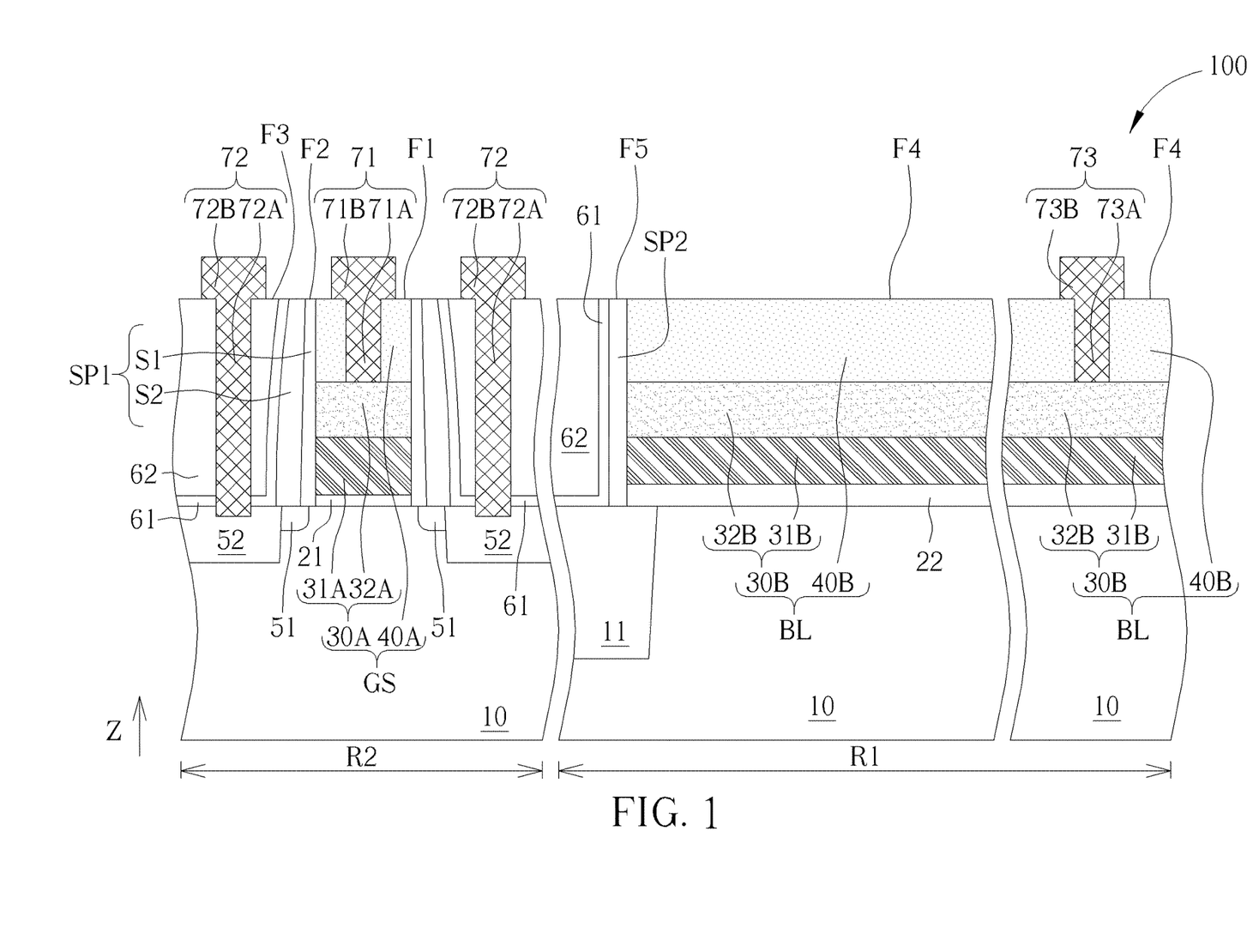
FIG. 1 is a schematic drawing illustrating a semiconductor memory device according to an embodiment of the present invention.

Please refer to FIG. 1. FIG. 1 is a schematic drawing illustrating a semiconductor memory device according to an embodiment of the present invention. As shown in FIG. 1, a semiconductor memory device 100 is provided in this embodiment. The semiconductor memory device 100 includes a semiconductor substrate 10, a gate structure GS, a first spacer structure SP1 and a gate connection structure 71. The semiconductor substrate 10 may include a silicon substrate, an epitaxial substrate, a silicon germanium substrate, a silicon carbide substrate, a silicon-on-insulator (SOI) substrate, or a semiconductor substrate made of other suitable materials. The semiconductor substrate 10 may include a memory cell region R1 and a peripheral region R2. In other words, a memory cell region R1 and a peripheral region R2 may be defined on the semiconductor substrate 10. A plurality of memory cells may be formed on the memory cell region R1, and other units except the memory cells, such as transistors configured to control signals for words lines and/or bit lines, may be formed on the peripheral region R2, but not limited thereto. The gate structure GS is disposed on the semiconductor substrate 10 and disposed on the peripheral region R2. In some embodiments, the gate structure GS may be a gate structure in a transistor or other units disposed on the peripheral region R2. The gate structure GS includes a first conductive layer 30A and a gate capping layer 40A, and the gate capping layer 40A may be disposed on the first conductive layer 30A in a thickness direction Z of the semiconductor substrate 10. The first conductive layer 30A may be a structure composed of a single layer of conductive material or a structure composed of multiple layers of conductive material. For example, in some embodiments, the first conductive layer 30A may include a first non-metallic conductive layer 31A and a first metal conductive layer 32A, and the first metal conductive layer 32A may be disposed on the first non-metallic conductive layer 31A in the thickness direction Z of the semiconductor substrate 10, but not limited thereto. In some embodiments, the first conductive layer 30A may be a single layer of a non-metallic conductive material or a single layer of a metal conductive material. The first non-metallic conductive layer 31A may include amorphous silicon, polysilicon, or other suitable silicon containing conductive materials; the first metal conductive layer 32A may include aluminum, tungsten, copper, titanium aluminide, or other suitable metal conductive materials with low electrical resistivity; and the gate capping layer 40A may include silicon nitride, silicon oxynitride, silicon carbonitride, or other suitable insulation materials, but not limited thereto. In addition, a gate dielectric layer 21, such as a silicon oxide layer, may be disposed between the gate structure GS and the semiconductor substrate 10, but not limited thereto.

The first spacer structure SP1 is disposed on a sidewall of the first conductive layer 30A and a sidewall of the gate capping layer 40A, and the first spacer structure SP1 may be a single layer spacer structure or a multiple layer spacer structure. For example, the first spacer structure SP1 may include a first spacer S1 and a second spacer S2. The first spacer S1 may be disposed between the second spacer S2 and the gate structure GS. The first spacer S1 and the second spacer S2 may be used in a doping process of forming a lightly doped region 51 in the semiconductor substrate 10 and a doping process of forming a source/drain region 52 in the semiconductor substrate respectively, but not limited thereto. The first spacer S1 and the second spacer S2 may be formed by different materials. For instance, the material of the first spacer S1 may be silicon nitride, and the material of the second spacer S2 may be silicon oxide, but not limited thereto.

The gate connection structure 71 includes a first part 71A and a second part 71B. The first part 71A penetrates the gate capping layer 40A and is electrically connected with the first conductive layer 30A. The second part 71B is connected with the first part 71A. The second part 71B is disposed on a top surface of the gate capping layer 40A (such as a first top surface F1 shown in FIG. 1), and the second part 71B contacts the first top surface F1 of the gate capping layer 40A. In addition, the first spacer structure SP1 formed on the sidewall of the gate capping layer 40A may have a second top surface F2, and the first top surface F1 of the gate capping layer 40A and the second top surface F2 of the first spacer structure SP1 may be coplanar, but not limited thereto. In some embodiments, the first part 71A of the gate connection structure 71 may be regarded as a conductive plug, and the second part 71B of the gate connection structure 71 may be regarded as metal-zero (M0), but not limited thereto. Additionally, in some embodiments, the first part 71A and the second part 71B of the gate connection structure 71 may be connected with each other and may be a monolithic structure, and the gate connection structure 71 may be formed by a barrier layer (not shown) and a low resistivity conductive material (not shown). The barrier layer mentioned above may include titanium, titanium nitride (TiN), or other single layer barrier structures or multiple layer barrier structures composed of other suitable barrier materials, and the low resistivity conductive material mentioned above may include materials such as aluminum, tungsten, copper, or titanium aluminide, but not limited thereto. In the semiconductor memory device of this embodiment, the gate connection structure 71 electrically connected with the gate structure GS on the peripheral region R2 may be partly formed on the first top surface F1 of the gate capping layer 40A and directly contact the first top surface F1 of the gate capping layer 40A. Accordingly, the gate connection structure 71 and other connection structures on the peripheral region R2 and/or the memory cell region R1 may be formed concurrently for process integration and process simplification.

As shown in FIG. 1, in some embodiments, the semiconductor memory device 100 may further include the source/drain region 52, an interlayer dielectric layer 62, and a source/drain connection structure 72. The source/drain region 52 is disposed in the semiconductor substrate 10 and disposed at a side of the gate structure GS. The interlayer dielectric layer 62 covers the source/drain region 52. The source/drain connection structure 72 may include a third part 72A and a fourth part 72B. The third part 72A may penetrate the interlayer dielectric layer 62 and be electrically connected with the source/drain region 52. The fourth part 72B is connected with the third part 72A. The fourth part 72B is disposed on a top surface of the interlayer dielectric layer 62 (such as a third top surface F3 shown in FIG. 1), and the fourth part 72B contacts the third top surface F3 of the interlayer dielectric layer 62. Additionally, in some embodiments, the third top surface F3 of the interlayer dielectric layer 62 and the first top surface F1 of the gate capping layer 40A may be coplanar, and the source/drain connection structure 72 and the gate connection structure 71 may be formed concurrently by the same process, but not limited thereto. In other words, the third part 72A and the fourth part 72B of the source/drain connection structure 72 may be connected with each other and may be a monolithic structure. The third part 72A of the source/drain connection structure 72 may be regarded as a conductive plug, and the fourth part 72B of the source/drain connection structure 72 may be regarded as metal-zero (M0), but not limited thereto. Additionally, in some embodiments, the semiconductor memory device 100 may further include a contact etching stop layer 61 disposed between the interlayer dielectric layer 62 and the source/drain region 52. The third part 72A of the source/drain connection structure 72 may further penetrate the contact etching stop layer 61 for contacting the source/drain region 52 and being electrically connected with the source/drain region 52. The material of the contact etching stop layer 61 may include silicon nitride or other suitable insulation materials, and the interlayer dielectric layer 62 may include silicon oxide or other suitable insulation materials.

As shown in FIG. 1, in some embodiments, the semiconductor memory device 100 may further include a bit line structure BL disposed on the semiconductor substrate 10 and disposed on the memory cell region R1. The bit line structure BL may include a second conductive layer 30B and a bit line capping layer 40B. The bit line capping layer 40B may be disposed on the second conductive layer 30B in the thickness direction Z of the semiconductor substrate 10. The second conductive layer 30B may be a structure composed of a single layer of conductive material or a structure composed of multiple layers of conductive material. For example, in some embodiments, the second conductive layer 30B may include a second non-metallic conductive layer 31B and a second metal conductive layer 32B, and the second metal conductive layer 32B may be disposed on the second non-metallic conductive layer 31B in the thickness direction Z of the semiconductor substrate 10, but not limited thereto. In some embodiments, the second conductive layer 30B may be a single layer of a non-metallic conductive material or a single layer of a metal conductive material. The second non-metallic conductive layer 31B may include amorphous silicon, polysilicon, or other suitable silicon containing conductive materials; the second metal conductive layer 32B may include aluminum, tungsten, copper, titanium aluminide, or other suitable metal conductive materials with low electrical resistivity; and the bit line capping layer 40B may include silicon nitride, silicon oxynitride, silicon carbonitride, or other suitable insulation materials, but not limited thereto. In other words, the composition of the second conductive layer 30B of the bit line structure BL disposed on the memory cell region R1 may be the same as the composition of the first conductive layer 30A of the gate structure GS disposed on the peripheral region R2, but not limited thereto.

In addition, a first dielectric layer 22 may be disposed between the bit line structure BL and the semiconductor substrate 10, and the first dielectric layer 22 may be a single layer structure or a multiple layer structure composed of stacked dielectric materials, such as an oxide-nitride-oxide (ONO) stack structure, but not limited thereto. In some embodiments, a shallow trench isolation 11 may be formed in the semiconductor substrate 10 for isolating the memory cell region R1 from the peripheral region R2 and/or defining a plurality of active areas (not shown) in the memory cell region R1 of the semiconductor substrate 10. The first dielectric layer 22 may be used to isolating the bit line structure BL from the active areas which are not corresponding to the bit line structure BL. The bit line structure BL may penetrate the first dielectric layer 22 for being electrically connected with the corresponding active area. The second non-metallic conductive layer 31B of the bit line structure BL may be used to improve the contact condition between the bit line structure BL and the corresponding active area, and the second metal conductive layer 32B of the bit line structure BL may be used to reduce the total electrical resistance of the bit line structure BL, but not limited thereto. In some embodiments, the thickness of the first dielectric layer 22 disposed on the memory cell region R1 may be larger than the thickness of the gate dielectric layer 21 disposed on the peripheral region R2, but the top surface of the bit line capping layer 40B (such as a fourth top surface F4 shown in FIG. 1) and the first top surface F1 of the gate capping layer 40A may be coplanar, but not limited thereto. Additionally, in some embodiments, the semiconductor memory device 100 may further include a second spacer structure SP2 disposed on a sidewall of the second conductive layer 30B and a sidewall of the bit line capping layer 40B, and the fourth top surface F4 of the bit line capping layer 40B and a top surface of the second spacer structure SP2 (such as a fifth top surface F5 shown in FIG. 1) may be coplanar, but not limited thereto. The material of the second spacer structure SP2 may include silicon nitride or other suitable insulation materials.

As shown in FIG. 1, the semiconductor memory device 100 may further include a bit line connection structure 73 in some embodiments. The bit line connection structure 73 may include a fifth part 73A and a sixth part 73B. The fifth part 73A penetrates the bit line capping layer 40B and is electrically connected with the second conductive layer 30B. The sixth part 73B is connected with the fifth part 73A. The sixth part 73B is disposed on the fourth top surface F4 of the bit line capping layer 40B, and the sixth part 73B contacts the fourth top surface F4 of the bit line capping layer 40B. In some embodiments, the first top surface F1 of the gate capping layer 40A, the second top surface F2 of the first spacer structure SP1, the third top surface F3 of the interlayer dielectric layer 62, the fourth top surface F4 of the bit line capping layer 40B, and the fifth top surface F5 of the second spacer structure SP2 may be coplanar; and the bit line connection structure 73, the source/drain connection structure 72, and the gate connection structure 71 may be formed concurrently by the same process and the same material, but not limited thereto. In other words, the fifth part 73A and the sixth part 73B of the bit line connection structure 73 may be connected with each other and may be a monolithic structure. The fifth part 73A of the bit line connection structure 73 may be regarded as a conductive plug, and the sixth part 73B of the bit line connection structure 73 may be regarded as metal-zero (M0), but not limited thereto. Additionally, in some embodiments, the first top surface F1 may be the topmost surface of the gate capping layer 40A in the thickness direction Z of the semiconductor substrate 10, the second top surface F2 may be the topmost surface of the first spacer structure SP1 in the thickness direction Z, the third top surface F3 may be the topmost surface of the interlayer dielectric layer 62 in the thickness direction Z, the fourth top surface F4 may be the topmost surface of the bit line capping layer 40B in the thickness direction Z, and the fifth top surface F5 may be the topmost surface of the second spacer structure SP2 in the thickness direction Z, but not limited thereto.

Figure 2:
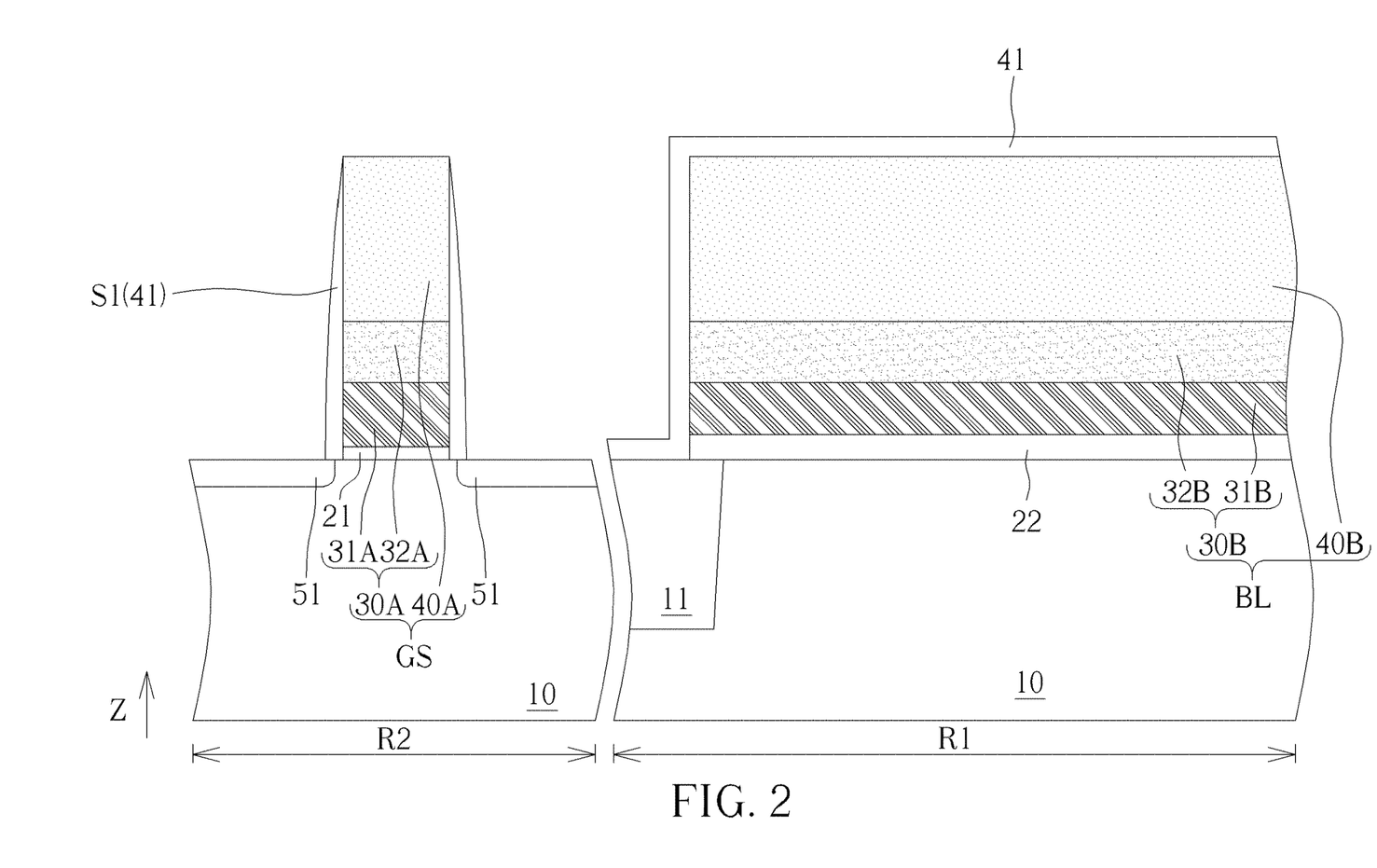

Please refer to FIGS. 1-5. FIGS. 2-5 are schematic drawings illustrating a manufacturing method of a semiconductor device according to an embodiment of the present invention, and FIG. 1 may be regarded as a schematic drawing in a step subsequent to FIG. 5. The manufacturing method of the semiconductor memory device in this embodiment may include but is not limited to the following steps. Firstly, as shown in FIG. 2, the gate dielectric layer is formed on the memory cell region R1 of the semiconductor substrate 10, and the first dielectric layer 22 is formed on the peripheral region R2. The bit line structure BL is than formed on the memory cell region R1 of the semiconductor substrate 10, and the gate structure GS is formed on the peripheral region R2. In some embodiments, the bit line structure BL and the gate structure GS may have similar compositions and may be formed concurrently by the same process. For example, the material composition of the first non-metallic conductive layer 31A may be identical to the material composition of the second non-metallic conductive layer 31B, the material composition of the first metal conductive layer 32A may be identical to the material composition of the second metal conductive layer 32B, and the material composition of the gate capping layer 40A may be identical to the material composition of the bit line capping layer 40B, but not limited thereto. Subsequently, a second dielectric layer 41 may be formed on the bit line structure BL and the gate structure GS, and an anisotropic etching process may be performed to the second dielectric layer 41 on the peripheral region R2 for forming the first spacer S1. A doping process (such as an ion implantation process) may be performed with the first spacer S1 as a mask for forming the lightly doped region 51 in the semiconductor substrate 10. In some embodiments, the second dielectric layer 41 may include silicon nitride or other suitable dielectric materials.

Figure 3:
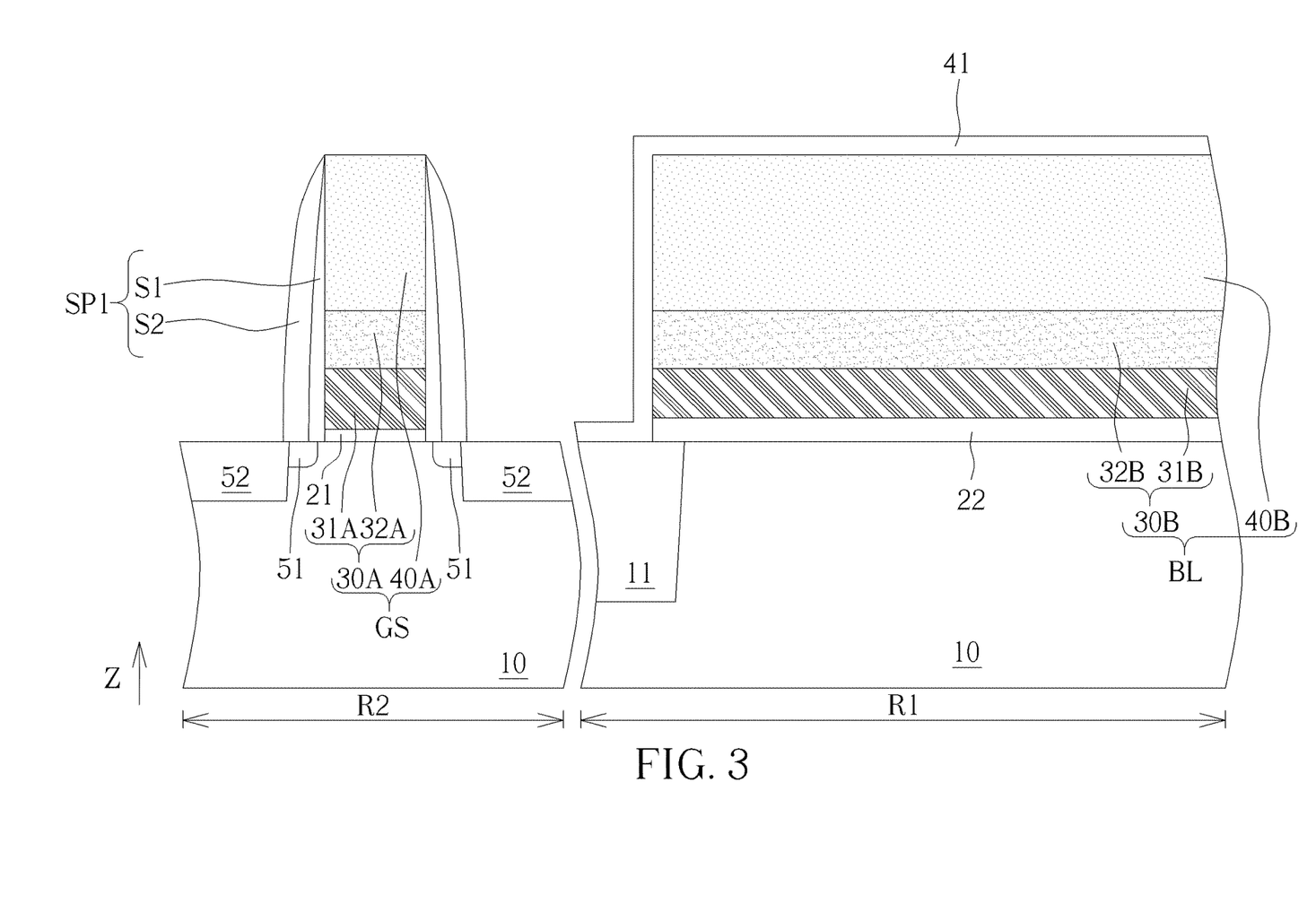
Figure 4:
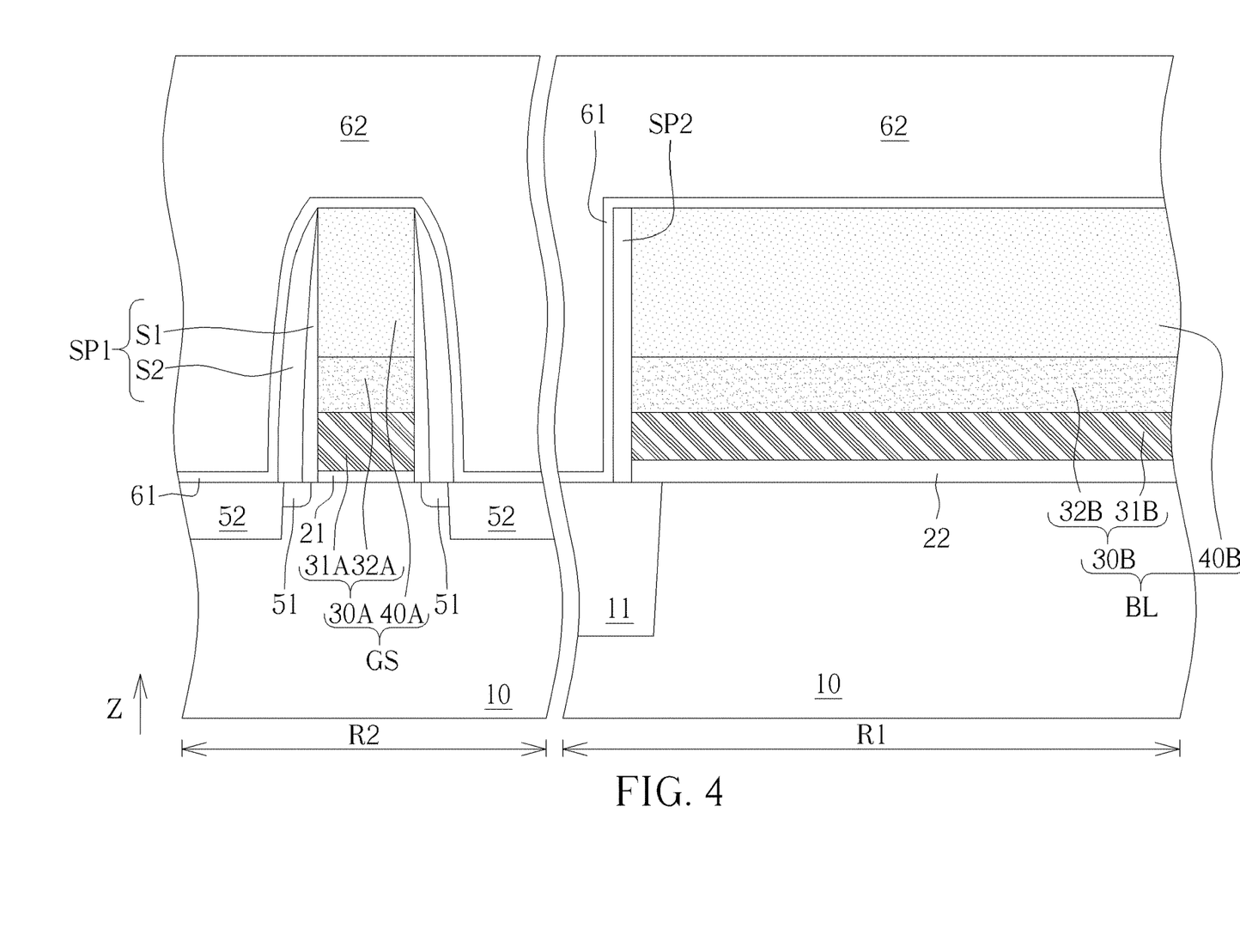
Figure 5:
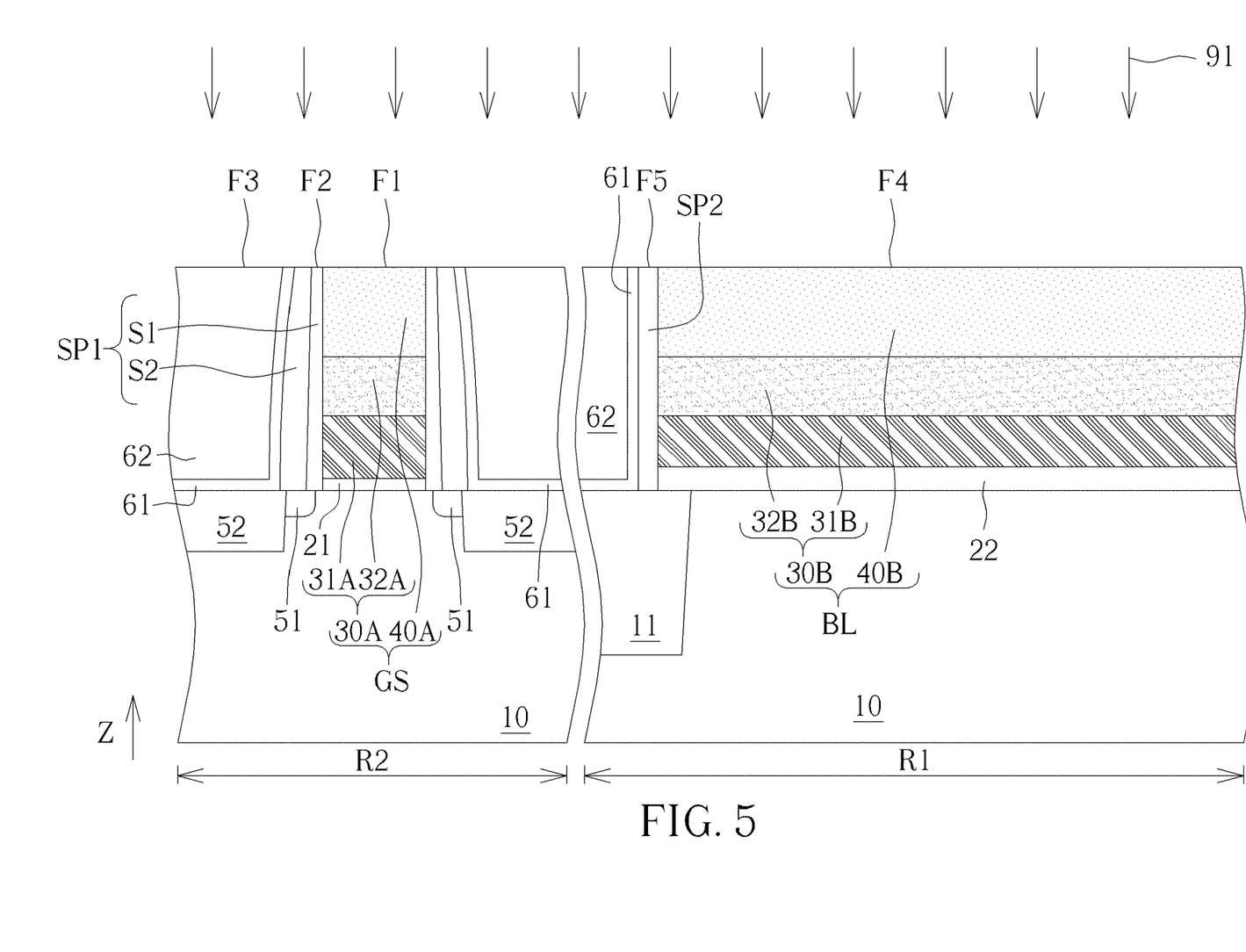

As shown in FIG. 3, the second spacer S2 is then formed on the sidewall of the first spacer S1, and another doping process may be performed with the second spacer S2 as a mask for forming the source/drain region 52 in the semiconductor substrate 10. Subsequently, as shown in FIG. 3 and FIG. 4, an anisotropic etching process is performed to the second dielectric layer 41 on the memory cell region R1 for forming the second spacer structure SP2, and the contact etching stop layer 61 and the interlayer dielectric layer 62 are formed covering the memory cell region R1 and the peripheral region R2. As shown in FIG. 4 and FIG. 5, after the steps of forming the contact etching stop layer 61 and the interlayer dielectric layer 62, a planarization process 91 is performed for making the first top surface F1 of the gate capping layer 40A, the second top surface F2 of the first spacer structure SP1, the third top surface F3 of the interlayer dielectric layer 62, the fourth top surface F4 of the bit line capping layer 40B, and the fifth top surface F5 of the second space structure SP2 substantially coplanar. The planarization process 91 may include a chemical mechanical polishing (CMP) process or other suitable planarization approaches. As shown in FIG. 5 and FIG. 1, after the planarization process 91, the gate connection structure 71, the source/drain connection structure 72, and the bit line connection structure 73 are formed. In some embodiments, a metal silicide layer (not shown) may be formed on the source/drain region 52 before the step of forming the source/drain connection structure 72 according to some considerations, and the source/drain connection structure 72 may be formed after the step of forming the metal silicide layer, but not limited thereto. Because the first top surface F1 of the gate capping layer 40A, the third top surface F3 of the interlayer dielectric layer 62, and the fourth top surface F4 of the bit line capping layer 40B may be substantially coplanar, the second part 71B of the gate connection structure 71, the fourth part 72B of the source/drain connection structure 72, and the sixth part 73B of the bit line connection structure 73 may be formed concurrently by the same process for process integration and process simplification.

To summarize the above descriptions, according to the semiconductor memory device in the present invention, the gate connection structure electrically connected with the gate structure disposed on the peripheral region may be partly formed on the first top surface of the gate capping layer and contact the first top surface of the gate capping layer. The gate connection structure, the source/drain connection structure disposed on the peripheral region and/or the bit line connection structure on the memory cell region may be formed concurrently by the same process. The purposes of process simplification and process integration between the units on the memory cell region and the units on the peripheral region may be achieved accordingly.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor memory device, comprising:
a semiconductor substrate comprising a memory cell region and a peripheral region;
a gate structure disposed on the semiconductor substrate and disposed on the peripheral region, wherein the gate structure comprises:
a first conductive layer; and
a gate capping layer disposed on the first conductive layer;
a first spacer structure disposed on a sidewall of the first conductive layer and a sidewall of the gate capping layer; and
a gate connection structure comprising:
a first part penetrating the gate capping layer and electrically connected with the first conductive layer; and
a second part connected with the first part, wherein the second part is disposed on a top surface of the gate capping layer, and the second part directly contacts the top surface of the gate capping layer.

2. The semiconductor memory device according to claim 1, wherein the top surface of the gate capping layer and a top surface of the first spacer structure are coplanar.

3. The semiconductor memory device according to claim 1, further comprising:
a source/drain region disposed in the semiconductor substrate and disposed at a side of the gate structure;
an interlayer dielectric layer covering the source/drain region; and
a source/drain connection structure, comprising:
a third part penetrating the interlayer dielectric layer and electrically connected with the source/drain region; and
a fourth part connected with the third part, wherein the fourth part is disposed on a top surface of the interlayer dielectric layer, and the fourth part contacts the top surface of the interlayer dielectric layer.

4. The semiconductor memory device according to claim 3, wherein the top surface of the interlayer dielectric layer and the top surface of the gate capping layer are coplanar.

5. The semiconductor memory device according to claim 3, further comprising:
a contact etching stop layer disposed between the interlayer dielectric layer and the source/drain region, wherein the third part of the source/drain connection structure further penetrates the contact etching stop layer.

6. The semiconductor memory device according to claim 1, wherein the first conductive layer comprises a first non-metallic conductive layer and a first metal conductive layer, and the first metal conductive layer is disposed on the first non-metallic conductive layer.

7. The semiconductor memory device according to claim 1, further comprising:
a bit line structure disposed on the semiconductor substrate and disposed on the memory cell region, wherein the bit line structure comprises:
a second conductive layer; and
a bit line capping layer disposed on the second conductive layer, wherein a top surface of the bit line capping layer and the top surface of the gate capping layer are coplanar.

8. The semiconductor memory device according to claim 7, further comprising:
a second spacer structure disposed on a sidewall of the second conductive layer and a sidewall of the bit line capping layer, wherein the top surface of the bit line capping layer and a top surface of the second spacer structure are coplanar.

9. The semiconductor memory device according to claim 7, further comprising:
a bit line connection structure, comprising:
a fifth part penetrating the bit line capping layer and electrically connected with the second conductive layer; and
a sixth part connected with the fifth part, wherein the sixth part is disposed on the top surface of the bit line capping layer, and the sixth part contacts the top surface of the bit line capping layer.

10. The semiconductor memory device according to claim 7, wherein the second conductive layer comprises a second non-metallic conductive layer and a second metal conductive layer, and the second metal conductive layer is disposed on the second non-metallic conductive layer.

11. The semiconductor memory device according to claim 7, wherein the composition of the second conductive layer is the same as the composition of the first conductive layer.

* * * * *